(12) United States Patent
Yen et al.

(10) Patent No.: US 9,053,264 B2
(45) Date of Patent: Jun. 9, 2015

(54) WHAT-IF SIMULATION METHODS AND SYSTEMS

(75) Inventors: Chia-Chih Yen, Taipei (TW); Che-Hua Shih, Zhu-Bei (TW); Chun-Chi Lin, Zhongpu Township, Chiayi County (TW)

(73) Assignees: Synopsys, Inc., Mountain View, CA (US); Synopsys Taiwan Co., Ltd., Taipei (TW)

( * ) Notice: Subject to any disclaimer, the term of this patent is extended or adjusted under 35 U.S.C. 154(b) by 673 days.

(21) Appl. No.: 13/269,085

(22) Filed: Oct. 7, 2011

(65) Prior Publication Data

US 2012/0239370 A1 Sep. 20, 2012

Related U.S. Application Data

(60) Provisional application No. 61/453,258, filed on Mar. 16, 2011.

(51) Int. Cl.
*G06F 17/50* (2006.01)
(52) U.S. Cl.
CPC .................................. *G06F 17/5022* (2013.01)
(58) Field of Classification Search
CPC ........................... G06F 17/5081; G06F 17/5022
USPC .............................................. 703/13; 716/106
See application file for complete search history.

(56) References Cited

U.S. PATENT DOCUMENTS

| 6,112,022 A * | 8/2000 | Wei .................................. 703/14 |
| 7,657,416 B1 * | 2/2010 | Subasic et al. .................. 703/13 |
| 8,527,926 B2 * | 9/2013 | Nitta ............................... 716/112 |
| 2009/0271748 A1 * | 10/2009 | Maturana et al. ................. 716/3 |
| 2011/0218792 A1 * | 9/2011 | Whisnant et al. ............... 703/16 |
| 2012/0131525 A1 * | 5/2012 | Oh et al. ........................ 716/108 |

OTHER PUBLICATIONS

Kahn et al. ""What-If" Analysis in Computer Simulation Models: A Comparative Survey With Some Estension"., 1990., Proc. 75h Int. Conf. on Mathematical and Computer Modelling. vol. 14. pp. 101-106.*

* cited by examiner

*Primary Examiner* — Eunhee Kim
(74) *Attorney, Agent, or Firm* — Kilpatrick Townsend & Stockton LLP

(57) ABSTRACT

What-if simulation methods and systems are provided. A design coding in HDL (Hardware Description Language) and a simulation result corresponding to the design are provided. A what-if design scope and a what-if time window are received. A portion of the design is extracted from the design according to the what-if design scope, and primary input signals are determined during the extraction of the sub-design. Then, what-if simulation data is extracted from the simulation result according to the primary input signals and the what-if time window. A what-if test bench is generated according to the what-if simulation data, wherein the what-if simulation data is read, and the signal values are fed to a simulator according to the what-if test bench.

20 Claims, 11 Drawing Sheets

WHAT-IF SIMULATION METHODS AND SYSTEMS

CROSS REFERENCE TO RELATED APPLICATIONS

This application claims the benefit of U.S. Provisional Application No. 61/453,258 filed Mar. 16, 2011, the entirety of which is incorporated by reference herein.

BACKGROUND OF THE INVENTION

1. Field of the Invention

The disclosure relates generally to verification for designs, and, more particularly, to simulation methods and systems for what-if analysis.

2. Description of the Related Art

Due to increasing design complexity, verification has become a major bottleneck in the chip design industry. Various verification methodologies have been adopted to verify whether design behaviors are correct. Among all those approaches, dynamic verification, such as simulation is still one of the major forces used to drive the verification progress.

Generally, simulations must be repeatedly performed due to what-if changes. It is understood that the what-if change may be a design change, a signal value change, or a combination of a design change and a signal value change. Conventionally, when a what-if change is given, the what-if change is applied, and the whole design is re-simulated using a simulator. It is noted that since the whole design is simulated and the simulation for each what-if change may take several hours or several days, it is difficult to conduct many what-if changes, and the turnaround time thereof is troublesome. Further, since the entire design and the what-if change are needed to be re-compiled, the time for compilation is also a concern.

BRIEF SUMMARY OF THE INVENTION

What-if simulation methods and systems are provided.

In an embodiment of a what-if simulation method, a design coding in HDL and a simulation result corresponding to the design are provided. A what-if design scope and a what-if time window are received. A portion of the design is extracted from the design according to the what-if design scope, and primary input signals are determined during the extraction of the sub-design. Then, what-if simulation data is extracted from the simulation result according to the primary input signals and the what-if time window. A what-if test bench is generated according to the what-if simulation data, wherein the what-if simulation data is read, and the signal values are fed to a simulator according to the what-if test bench.

An embodiment of a what-if simulation system comprises a storage unit and a processing unit. The storage unit comprises a design coding in HDL and a simulation result corresponding to the design. The processing unit receives a what-if design scope and a what-if time window. The processing unit extracts a portion of the design from the design according to the what-if design scope, and determines primary input signals during the extraction of the sub-design. The processing unit extracts what-if simulation data from the simulation result according to the primary input signals and the what-if time window. The processing unit generates a what-if test bench according to the what-if simulation data, wherein the what-if simulation data is read, and the signal values are fed to a simulator according to the what-if test bench.

In some embodiments, a what-if change is further received, and the extracted design is modified, or the what-if test bench is modified, or both, according to the what-if change. The simulator simulates the modified extracted design with the modified what-if test bench to generate a what-if result.

During the extraction of the extracted design, in some embodiments, the design hierarchy of the original design is kept in the extracted design, and HDL codes which are out of the what-if design scope are removed. In some embodiments, if a system task/function is in the what-if design scope, the system task/function is unchanged or replaced with an empty faked task/function based on a type of the system task/function. In some embodiments, if a user PLI function is in the what-if design scope, the user PLI function is replaced with an empty function, wherein signals directly affected by the user PLI function are treated as primary input signals to the extracted design. In some embodiments, if an initial block is in the what-if design scope, codes except signal declarations are removed from the initial block. In some embodiments, if a macro reference or an include reference is in the what-if design scope, the macro reference or the include reference is expanded in the extracted design. In some embodiments, if a module outside of the what-if design scope contains signals which are hierarchically referenced in the what-if design scope, codes except declarations of the hierarchically referenced signals are removed from the module, and signals which are hierarchically referenced in the what-if design scope are treated as primary input signals to the extracted design. Furthermore, primary input signals comprise input and input-output ports of the extracted design.

During the extraction of the what-if simulation data, in some embodiments, design behaviors of the extracted design are analyzed to obtain restore signals. A restore time window prior to the what-if time window is determined according to the extracted design and the cycle time of a clock signal. Then, the what-if simulation data is retrieved from the simulation result for the restore signals in the restore time window, and the what-if simulation data is retrieved from the simulation result for the primary input signals in the restore time window and the what-if time window.

During the generation of the what-if test bench, in some embodiments, force/release commands are used for the restore signals in the restore time window, wherein in the restore time window, the signal values of the restore signals are unchanged from the original simulation result. In some embodiments, assignment commands are used for primary input signals in the what-if time window. In some embodiments, weak assignment commands are used for input-output port signals in the what-if time window, wherein the input-output port signals are obtained by analyzing the HDL of the extracted design. In some embodiments, at least one delay command is used in between the setting of signal values to primary input signals based on the event sequence order for the changed time of the respective signal value, such that the event sequence order in the what-if test bench is kept the same with that in the original simulation result.

What-if simulation methods may take the form of a program code embodied in a tangible media. When the program code is loaded into and executed by a machine, the machine becomes an apparatus for practicing the disclosed method.

BRIEF DESCRIPTION OF THE DRAWINGS

The invention will become more fully understood by referring to the following detailed description with reference to the accompanying drawings, wherein.

DETAILED DESCRIPTION OF THE INVENTION

What-if simulation methods and systems are provided.

Figure 1:
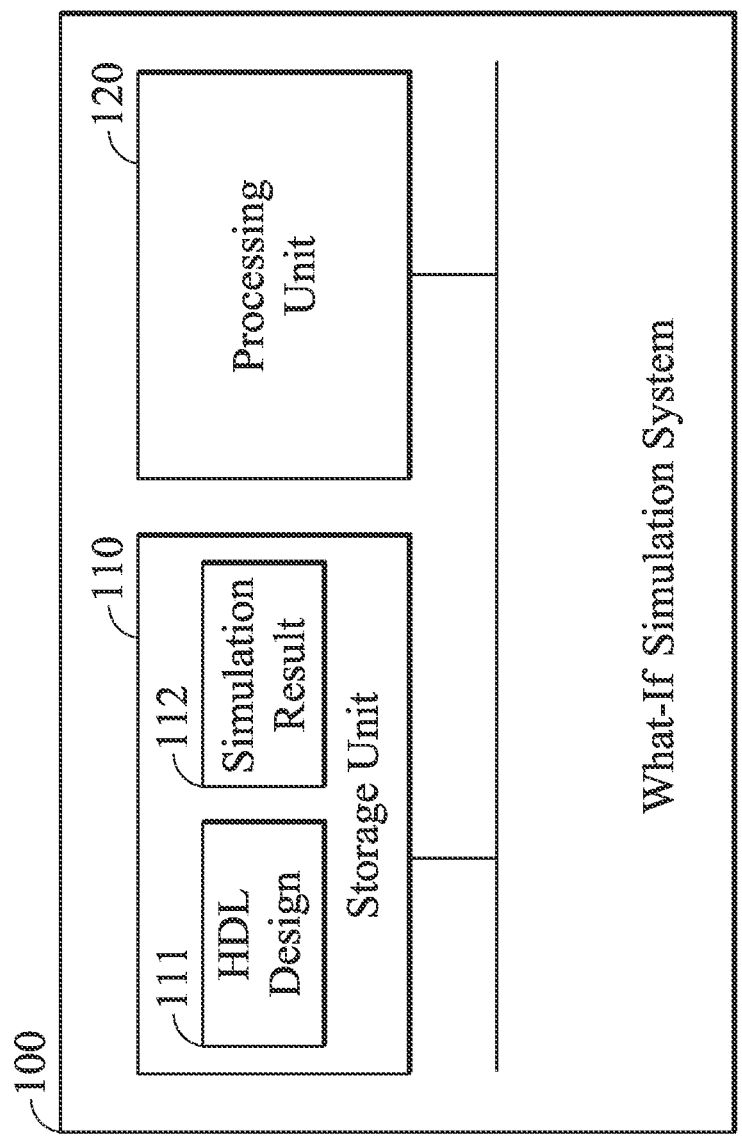
FIG. 1 is a schematic diagram illustrating an embodiment of a what-if simulation system of the invention.

FIG. 1 is a schematic diagram illustrating an embodiment of a what-if simulation system of the invention. The what-if simulation system 100 can be implemented in an electronic device, such as a computer system.

The what-if simulation system 100 comprises a storage unit 110 and a processing unit 120. The storage unit 110 comprises an HDL design 111 (coding in HDL) and a simulation result 112 corresponding to the HDL design 111. It is noted that the HDL design 111 can be simulated using a simulator (not shown) executed by the processing unit 120 such that the simulation result 112 is accordingly generated by the simulator. It is understood that, in some embodiments, the simulation result may comprise signal values of signals, a changed time of the respective signal value, and an event sequence order for the changed time of the respective signal value. The processing unit 120 can perform the what-if simulation method of the invention according to the HDL design 111, the simulation result 112, and what-if scenarios (not shown in FIG. 1), which will be discussed further in the following paragraphs. It is understood that the what-if simulation system 100 may further comprise a display unit (not shown in FIG. 1) for displaying related interfaces and/or data generated by the processing unit 120.

Figure 2:
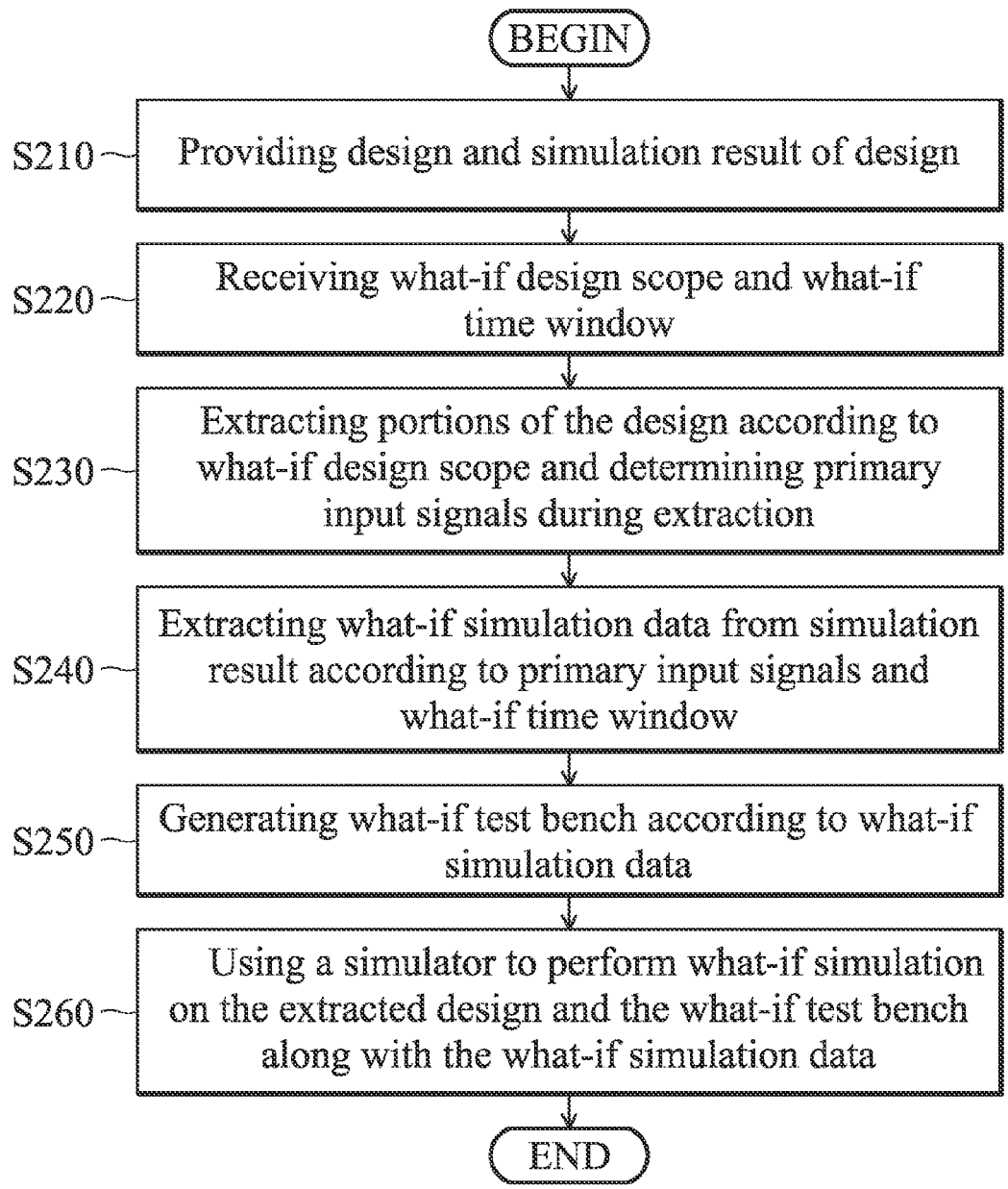
FIG. 2 is a flowchart of an embodiment of a what-if simulation method of the invention.

FIG. 2 is a flowchart of an embodiment of a what-if simulation method of the invention. The what-if simulation method can be implemented in an electronic device, such as a computer system.

In step S210, a design coding in HDL and a simulation result corresponding to the design are provided. As described, a simulator can simulate the HDL design to generate the simulation result. Similarly, the simulation result may comprise signal values of signals, a changed time of the respective signal value, and an event sequence order for the changed time of the respective signal value. In step S220, a what-if design scope and a what-if time window are received. Then, in step S230, a sub-design corresponding to the what-if design scope is extracted from the design according to the what-if design scope. It is understood that primary input signals are determined during the extraction of the sub-design. In step S240, what-if simulation data is extracted from the simulation result according to the primary input signals determined in step S230 and the what-if time window received in step S220. Then, in step S250, a what-if test bench is generated according to the what-if simulation data extracted in step S240. Finally in step S260, a simulator is used to perform the what-if simulation on the sub-design extracted in step S230 and the what-if test bench generated in step S250 along with the what-if simulation data extracted in step S240.

Figure 3:
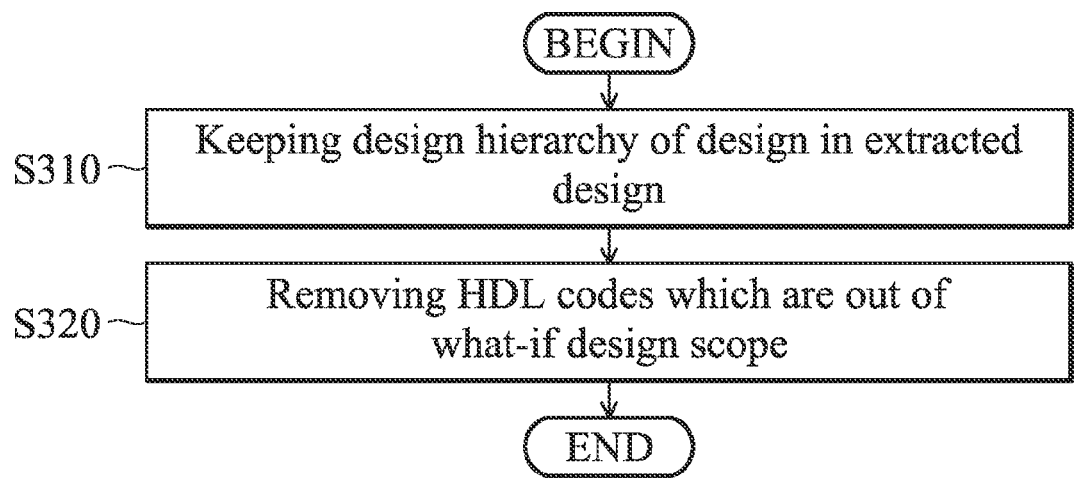
FIG. 3 is a flowchart of an embodiment of a method for extracting a sub-design for a what-if design scope of the invention.
Figure 11A:
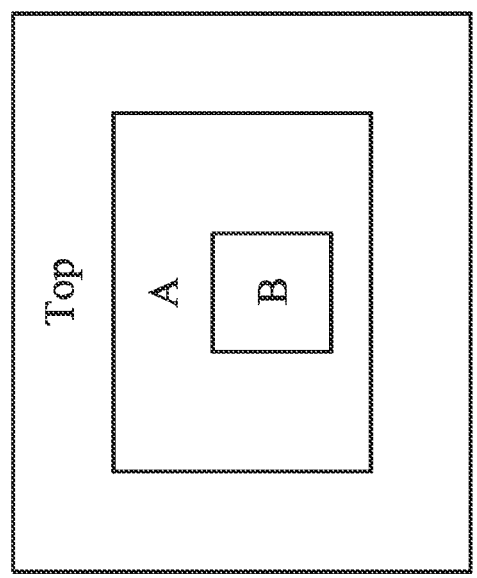
FIGS. 11A and 11B are schematic diagrams illustrating embodiments of an example of design hierarchy before and after design extraction of the invention.
Figure 11B:
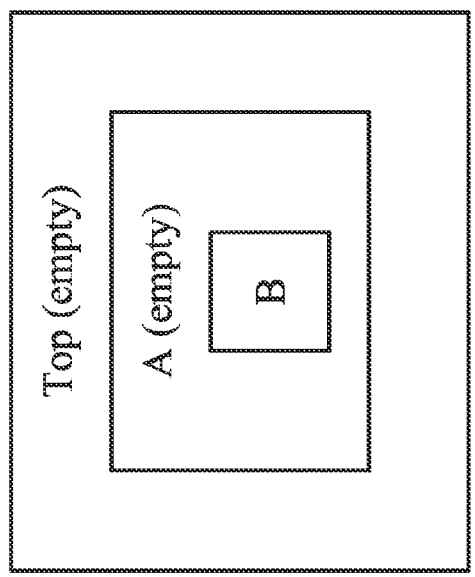

FIG. 3 is a flowchart of an embodiment of a method for extracting a sub-design for a what-if design scope of the invention. In step S310, the design hierarchy of the original design is kept in the extracted design, and in step S320, HDL codes which are out of the what-if design scope are removed from the extracted design. For example, for a design hierarchy shown in FIG. 11A, suppose the what-if design scope is Top.A.B, the top module Top and the instance Top.A are kept in the extracted design, but the codes in Top and Top.A are all removed, and the codes in B are kept intact, as shown in FIG. 11B. After the design extraction, the hierarchy of scope B is still Top.A.B.

Figure 4:
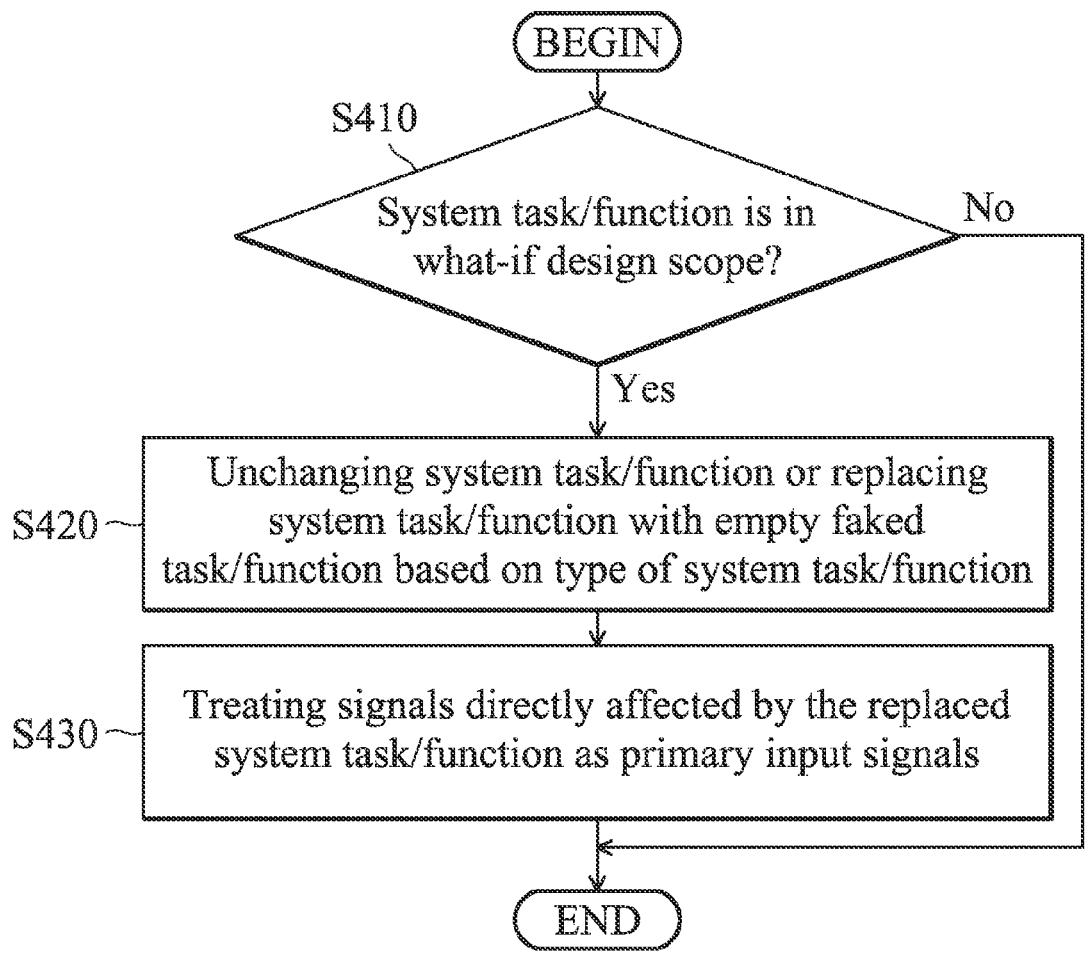
FIG. 4 is a flowchart of another embodiment of a method for extracting a sub-design for a what-if design scope of the invention.

FIG. 4 is a flowchart of another embodiment of a method for extracting a design for a what-if design scope of the invention. In step S410, it is determined whether a system task/function is in the what-if design scope. If no system task/function is in the what-if design scope (No in step S410), the procedure is terminated. If a system task/function is in the what-if design scope (Yes in step S410), in step S420, the system task/function is unchanged or replaced with an empty faked task/function based on a type of the system task/function. For example, if the system task/function is $time, it is kept unchanged. If the system task/function is $fopen, it is replaced with a faked empty task/function. In step S430, signals which are directly affected by the replaced system task/function are treated as primary input signals to the sub-design. Primary input signals can be used in the extraction of what-if simulation data, which will be discussed later.

Figure 5:
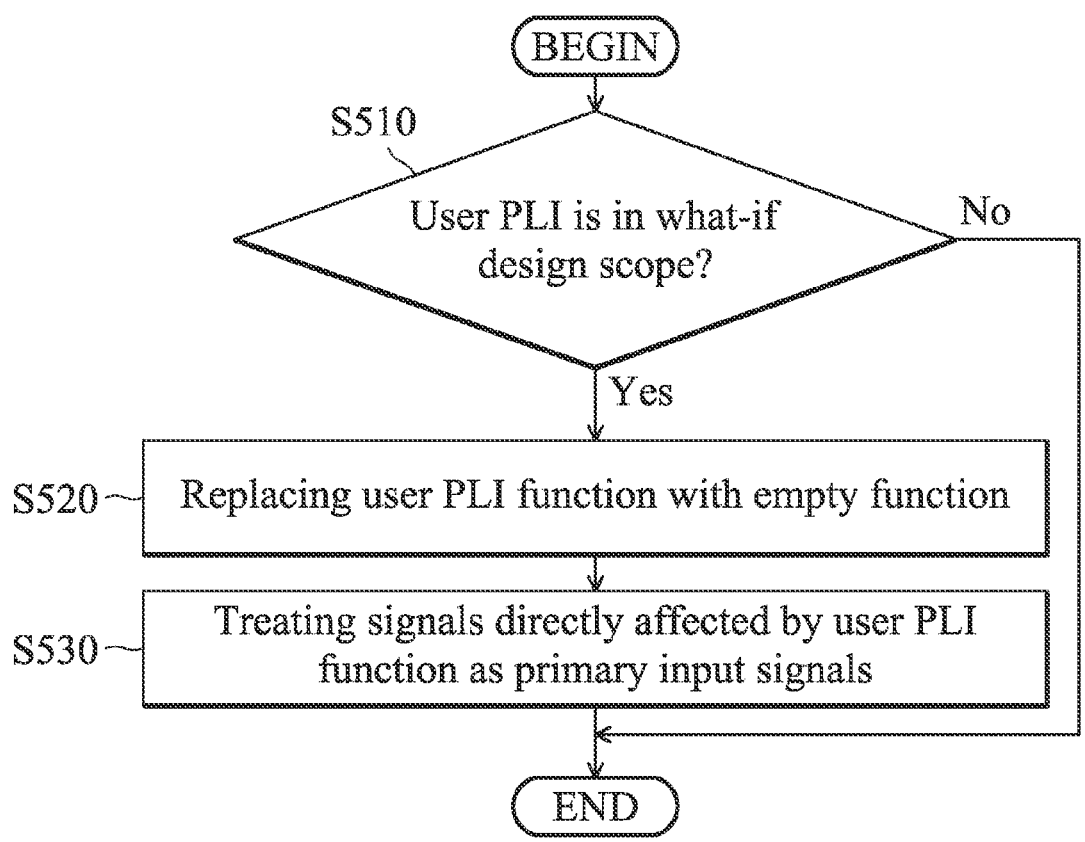
FIG. 5 is a flowchart of another embodiment of a method for extracting a sub-design for a what-if design scope of the invention.

FIG. 5 is a flowchart of another embodiment of a method for extracting a sub-design for a what-if design scope of the invention. In step S510, it is determined whether a user PLI function is in the what-if design scope. If no user PLI function is in the what-if design scope (No in step S510), the procedure is terminated. If a user PLI function is in the what-if design scope (Yes in step S510), in step S520, the user PLI function is replaced with an empty function, and in step S530, signals which are directly affected by the user PLI function, such as the LHS signals of the function, are treated as primary input signals to the sub-design.

Figure 6:
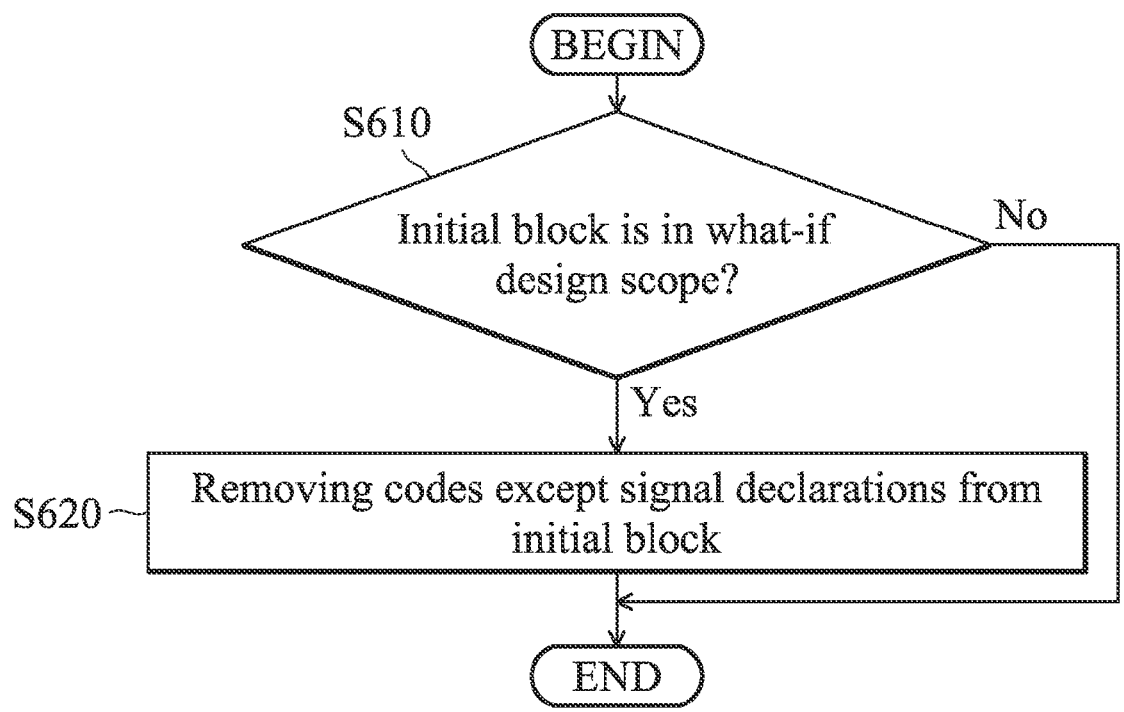
FIG. 6 is a flowchart of another embodiment of a method for extracting a sub-design for a what-if design scope of the invention.

FIG. 6 is a flowchart of another embodiment of a method for extracting a sub-design for a what-if design scope of the invention. In step S610, it is determined whether an initial block is in the what-if design scope. If no initial block is in the what-if design scope (No in step S610), the procedure is terminated. If an initial block is in the what-if design scope (Yes in step S610), in step S620, codes except signal declarations are removed from the initial block. For example, the what-if design scope has an initial block as follows:

```
            initial begin
                int B;
                ...
                wait (A);
                B = 2;
                ...
            end
```

After the design extraction, the extracted design for the initial block is shown as follows:

```
            initial begin
                int B;
            end
```

Figure 7:
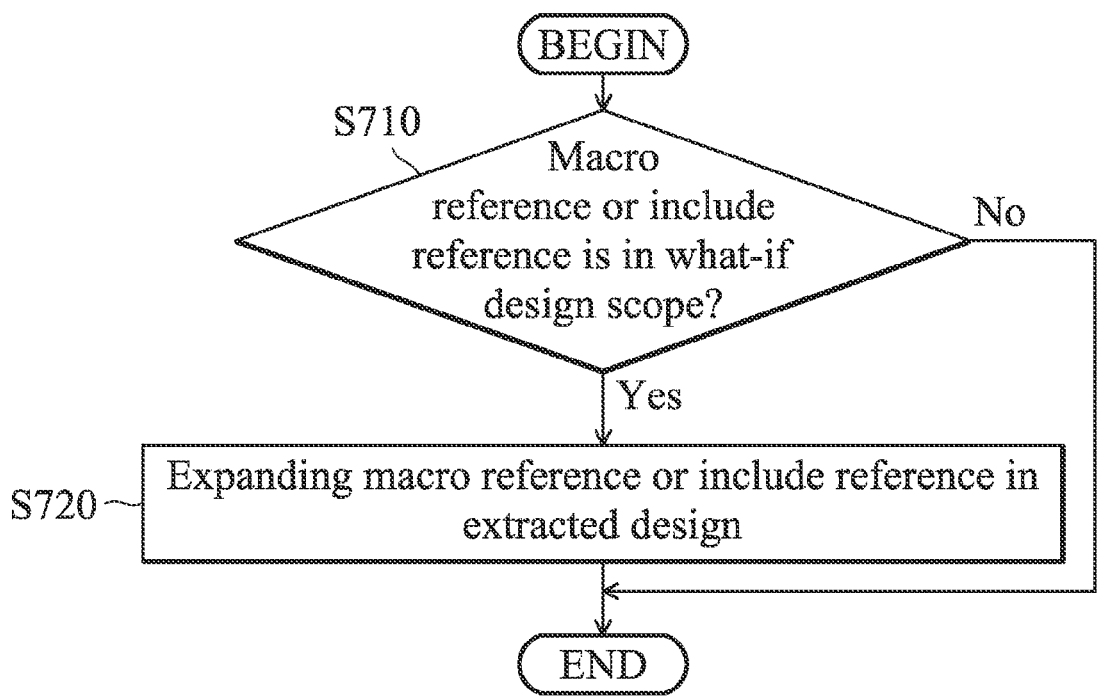
FIG. 7 is a flowchart of another embodiment of a method for extracting a sub-design for a what-if design scope of the invention.

FIG. 7 is a flowchart of another embodiment of a method for extracting a sub-design for a what-if design scope of the invention. In step S710, it is determined whether a macro reference or an include reference is in the what-if design scope. If no macro reference and no include reference is in the what-if design scope (No in step S710), the procedure is terminated. If a macro reference or an include reference is in the what-if design scope (Yes in step S710), in step S720, the macro reference or the include reference is expanded in the extracted design.

Figure 8:
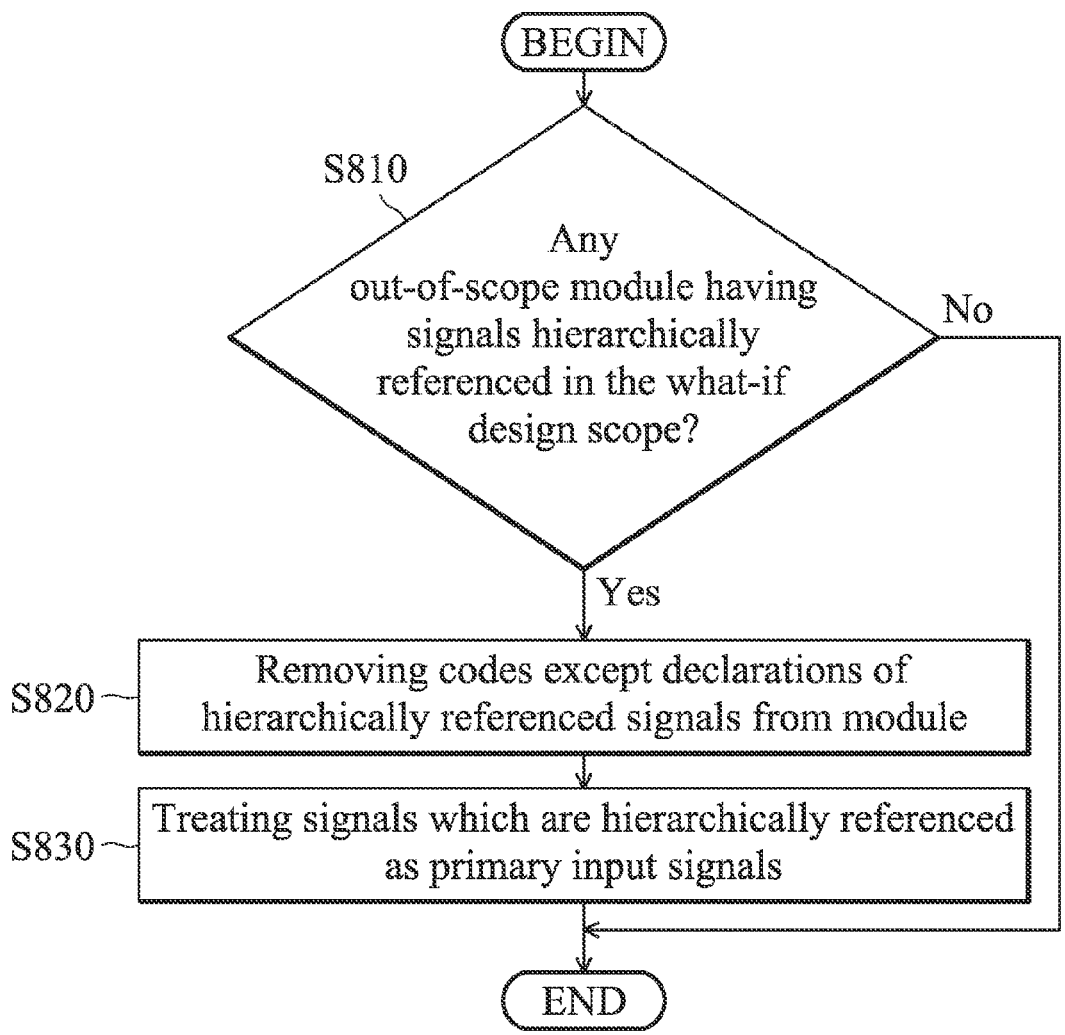
FIG. 8 is a flowchart of another embodiment of a method for extracting a sub-design for a what-if design scope of the invention.

FIG. 8 is a flowchart of another embodiment of a method for extracting a sub-design for a what-if design scope of the invention. In step S810, it is determined whether a module outside of the what-if design scope contains signals which are hierarchically referenced within the what-if design scope. If no such modules are found (No in step S810), the procedure is terminated. If a module outside of the what-if design scope contains signals which are hierarchically referenced within the what-if design scope (Yes in step S810), in step S820, codes except declarations of the hierarchically referenced signals are removed from the module and in step S830, signals which are hierarchically referenced are treated as primary input signals.

Referring back to FIG. 2, after the sub-design corresponding to the what-if design scope is extracted from the original design, in step S240, what-if simulation data is extracted from the simulation result according to the primary input signals and the what-if time window. That is, simulation data, such as signal values of primary input signals, a changed time of the respective signal value, and an event sequence order for the changed time of the respective signal value, corresponding to the primary input signals and within the what-if time window is retrieved from the simulation result of the HDL design. It is understood that primary input signals comprise the input and input-output ports of the extracted design and those signals determined in FIGS. 5 through 8. It is also understood that before the begin-time of the what-if time window, the state of the design must be restored, and so related restore signals must be determined. The restore signals comprise the primary input signals and other necessary-to-restore signals, such as memory and registers (latch or FF outputs). It is understood that, in some embodiments, some signal values can be restored by design evaluation through above restore signals.

Figure 9:
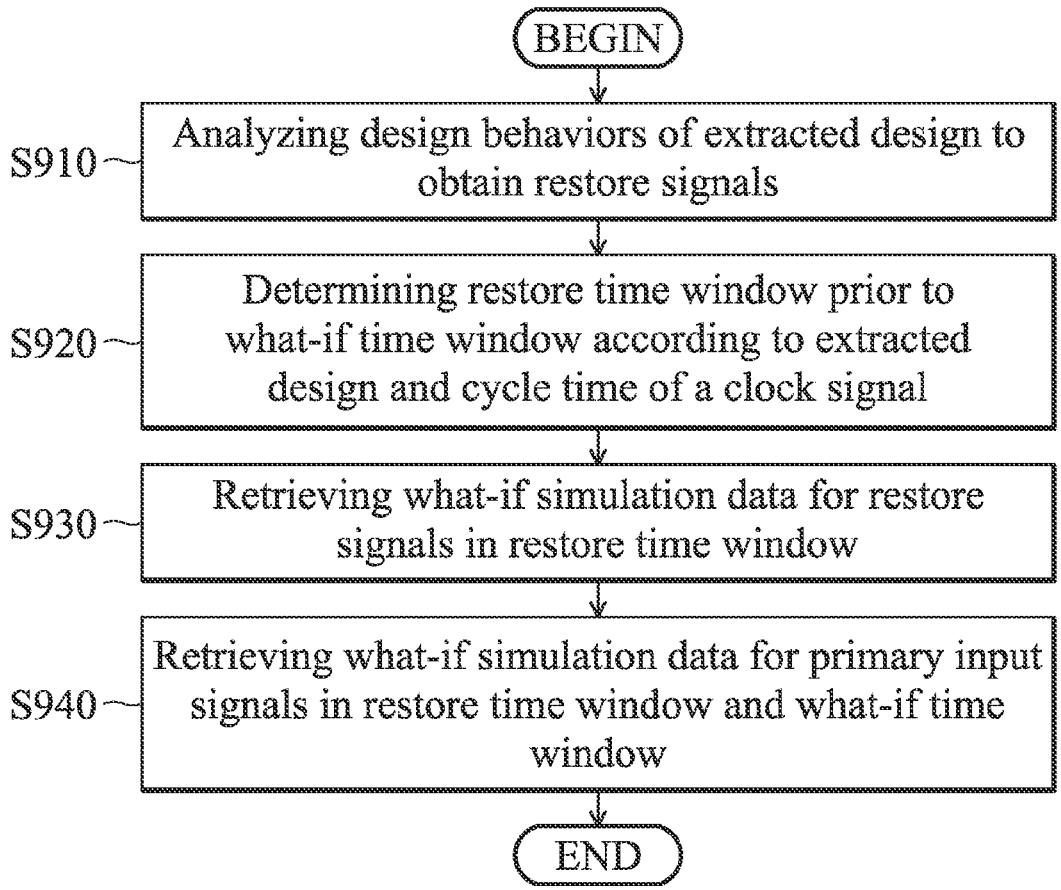
FIG. 9 is a flowchart of an embodiment of a method for extracting what-if simulation data of the invention.

FIG. 9 is a flowchart of an embodiment of a method for extracting what-if simulation data of the invention. First, in step S910, design behaviors of the extracted design are analyzed to obtain restore signals. In step S920, a restore time window prior to the what-if time window is determined according to the extracted design and the cycle time of a clock signal. It is noted that when signal values of the restore signals are given, the simulator needs a small time region to propagate the values to other non-restore signals. Consequently, to ensure that the simulation is correct, the restore time window prior to the what-if time window must be determined. It is understood that, in some embodiments, the signal values of the restore signals are kept unchanged in the restore time window. It is further understood that, in some embodiments, the maximum clock cycle time of the design can be obtained, and the restore time window will be around a few cycles of the maximum clock cycle. Then, in step S930, the what-if simulation data for the restore signals is retrieved from the simulation result in the restore time window, and in step S940, the what-if simulation data for the primary input signals is retrieved from the simulation result in the restore time window and the what-if time window. Similarly, the what-if simulation data for the restore signals or the primary input signals may comprise signal values of primary input signals, a changed time of the respective signal value, and an event sequence order for the changed time of the respective signal value. It is noted that, as described, the signal values of the restore signals are unchanged in the restore time window. However, the signal values of the primary input signals may be overridden by calculated values generated during simulation. It is understood that, in some embodiments, a file, such as a ROM code for the what-if simulation data can be written out.

Referring back to FIG. 2, after the what-if simulation data is generated, in step S250, a what-if test bench is generated according to the what-if simulation data. It is understood that based on the what-if test bench the what-if simulation data is read, and the signal values are fed to a simulator. It is understood that, in some embodiments, a specific PLI task is employed in the what-if test bench to read the what-if simulation data, and feed the signal values to the simulator. Further, it is understood that, in some embodiments, during the generation of the what-if test bench, force/release commands can be used in the specific PLI task for the restore signals in the restore time window. In some embodiments, assignment commands can be used in the specific PLI task for the primary input signals in the what-if time window. In some embodiments, weak assign commands can be used in the specific PLI task for input-output ports in the what-if time window, wherein the input-output ports are obtained by analyzing the HDL of the extracted design. In some embodiments, since the event sequence order may affect the sample value of a signal, in order to ensure that the event sequence order in the what-if test bench is the same as that in the what-if simulation data, at least one delay command, such as #0, is used in between the assignments of signal values to primary input signals in the specific PLI task based on the event sequence order for the changed time of the respective signal value.

By using the embodiments of FIG. 2, the extracted design corresponding to the what-if design scope and the what-if test bench generated based on the what-if simulation data for the extracted design in the what-if time window are obtained. When a what-if change is received, the simulation for the extracted design with the what-if change can be rapidly performed.

Figure 10:
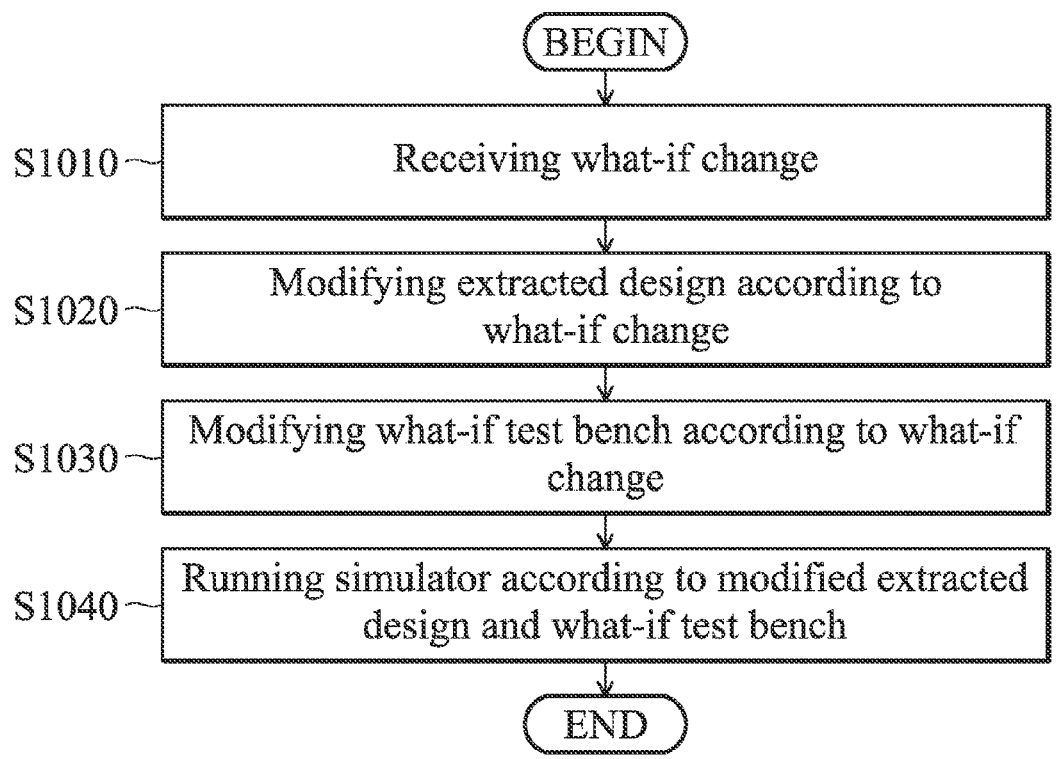
FIG. 10 is a flowchart of another embodiment of a what-if simulation method of the invention.

FIG. 10 is a flowchart of another embodiment of a what-if simulation method of the invention that accommodates what-if change. In step S1010, a what-if change is received. It is understood that, in some embodiments, the what-if change may be a design change, a signal value change, or a combination of a design change and a signal value change. After the what-if change is received, in step S1020, the extracted design is modified according to the what-if change if it contains a design change. It is understood that, in some embodiments, the what-if design change can be first transformed into an HDL file, and is then used to modify the extracted design. Likewise, in step S1030, the what-if test bench is modified according to the what-if change if it contains a signal value change. Then, in step S1040, the simulator runs the modified extracted design and the modified what-if test bench, thus to generate a what-if result by the simulator. It is understood that, in some embodiments, the extracted design, the transformed what-if change, and the what-if test bench can be packed as a run file for the simulator, and the simulator will execute in accordance with the run file and output the what-if result.

Therefore, the what-if simulation methods and systems can extract a part of a design corresponding to the what-if design scope which users are focused on, and generate a what-if test bench using a previous simulation result for a user-interested what-if time window, thus to rapidly perform a what-if simulation.

What-if simulation methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed:

1. A method comprising:
receiving, at one or more computer systems, a design coding in HDL (Hardware Description Language);
receiving, at the one or more computer systems, a simulation result corresponding to a simulation performed with the design, wherein the simulation result comprises signal values of signals, a changed time of the respective signal value, and an event sequence order for the changed time of the respective signal value;
receiving, at the one or more computer systems, a what-if design scope and a what-if time window;
extracting, with one or more processors associated with the one or more computer systems, a portion of the design according to the what-if design scope to generate a sub-design;
determining, with the one or more processors associated with the one or more computer systems, primary input signals of the sub-design;
extracting, with the one or more processors associated with the one or more computer systems, what-if simulation data from the simulation result according to the primary input signals and the what-if time window, wherein the what-if simulation data comprises the signal values of the primary input signals within the what-if time window, the changed time of the respective signal value, and the event sequence order for the changed time of the respective signal value; and
generating, with the one or more processors associated with the one or more computer systems, a what-if test bench according to the what-if simulation data, wherein the what-if simulation data is read, and the signal values are input to a simulator according to the what-if test bench.

2. The method of claim 1, further comprising:
receiving a what-if design change;
modifying the extracted design according to the what-if design change; and
running the simulator according to the modified extracted design and the what-if test bench, thus to generate a what-if result by the simulator.

3. The method of claim 1, further comprising:
receiving a what-if value change;
modifying the what-if test bench according to the what-if value change; and
running the simulator according to the extracted design and the modified what-if test bench, thus to generate a what-if result by the simulator.

4. The method of claim 1, wherein during the extraction of the sub-design, the design hierarchy of the original design is kept in the extracted design, and HDL codes which are out of the what-if design scope are removed from the extracted design.

5. The method of claim 1, wherein during the extraction of the sub-design, the method further comprises:
determining whether a system task/function is in the what-if design scope; and
if a system task/function is in the what-if design scope, unchanging the system task/function or replacing the system task/function with an empty faked task/function based on a type of the system task/function.

6. The method of claim 1, wherein during the extraction of the sub-design, the method further comprises:
determining whether a user PLI function is in the what-if design scope; and
if a user PLI function is in the what-if design scope, replacing the user PLI function with an empty function,
wherein signals directly affected by the user PLI function are treated as primary input signals.

7. The method of claim 1, wherein during the extraction of the sub-design, the method further comprises:
determining whether an initial block is in the what-if design scope; and
if an initial block is in the what-if design scope, removing codes except signal declarations from the initial block.

8. The method of claim 1, wherein during the extraction of the sub-design, the method further comprises:
determining whether a macro reference or an include reference is in the what-if design scope; and
if a macro reference or an include reference is in the what-if design scope, expanding the macro reference or the include reference in the extracted design.

9. The method of claim 1, wherein during the extraction of the sub-design, the method further comprises:
determining whether a module, which is outside of the what-if design scope, contains signals which are hierarchically referenced in the what-if design scope; and
if the module contains signals which are hierarchically referenced in the what-if design scope, adding the module to the design scope and removing codes except declarations of the hierarchically referenced signals from the module, and treating those signals as primary input signals.

10. The method of claim 1, wherein the primary input signals comprise input and in-out ports of the extracted design.

11. The method of claim 1, wherein during the extraction of the what-if simulation data, the method further comprises:
analyzing design behaviors of the extracted design to obtain restore signals;
determining a restore time window prior to the what-if time window according to the extracted design and the cycle time of a clock signal;
extracting the what-if simulation data from the simulation result for the restore signals in the restore time window; and
extracting the what-if simulation data from the simulation result for the primary input signals in the restore time window and the what-if time window.

12. The method of claim 11, further comprising writing out a file for the what-if simulation data.

13. The method of claim 11, wherein the generated what-if test bench uses force commands to force signal values for the restore signals in the restore time window according to the extracted simulation data, and uses release commands to stop forcing signal values for the restore signals at the end of the restore window.

14. The method of claim 1, wherein the generated what-if test bench uses assignment commands to assign signal values to the primary input signals which are not in-out ports of the extracted design in the what-if time window.

15. The method of claim 1, wherein the generated what-if test bench uses weak assignment commands to assign signal values to primary input signals which are in-out ports of the extracted design in the what-if time window.

16. The method of claim 1, wherein the generated what-if test bench uses at least one delay command in between the setting of signal values to primary input signals based on the event sequence order for the changed time of the respective signal value, such that the event sequence order in the what-if test bench is kept the same with that in the what-if simulation data.

17. The method of claim 11, wherein the what-if test bench employs a PLI task to read signal values from the what-if simulation data and feed the signal values to the simulator.

18. A system comprising:
a hardware processor; and
a non-transitory memory storing a set of instruction which when executed at the processor cause the processor to:
receive a design coding in HDL (Hardware Description Language);
receive a simulation result corresponding to a simulation performed with the design, wherein the simulation result comprises signal values of signals, a changed time of the respective signal value, and an event sequence order for the changed time of the respective signal value;
receive a what-if design scope and a what-if time window;
extract a sub-design from the design according to the what-if design scope;
determine primary input signals of the sub-design;
extract what-if simulation data from the simulation result according to the primary input signals and the what-if time window, wherein the what-if simulation data comprises the signal values of the primary input signals within the what-if time window, the changed time of the respective signal value, and the event sequence order for the changed time of the respective signal value; and
generate a what-if test bench according to the what-if simulation data, wherein the what-if simulation data is read, and the signal values are input to a simulator according to the what-if test bench.

19. A non-transitory machine-readable medium comprising a computer program, which, when executed, causes a processor of a device to:
receive a design coding in HDL (Hardware Description Language);
receive a simulation result corresponding to a simulation performed with the design, wherein the simulation result comprises signal values of signals, a changed time of the respective signal value, and an event sequence order for the changed time of the respective signal value;
receive a what-if design scope and a what-if time window;
extract a sub-design from the design according to the what-if design scope;
determine primary input signals of the sub-design;
extract what-if simulation data from the simulation result according to the primary input signals and the what-if time window, wherein the what-if simulation data comprises the signal values of the primary input signals within the what-if time window, the changed time of the respective signal value, and the event sequence order for the changed time of the respective signal value; and
generate a what-if test bench according to the what-if simulation data, wherein the what-if simulation data is read, and the signal values are input to a simulator according to the what-if test bench.

20. The non-transitory machine-readable medium of claim 19 wherein:
the computer program product further causes the processor to:
receive a what-if design change,
modify the extracted design according to the what-if design change, and
run the simulator according to the modified extracted design and the what-if test bench, thus to generate a what-if result by the simulator;
the computer program product further causes the processor to:
receive a what-if value change,
modify the what-if test bench according to the what-if value change, and
run the simulator according to the extracted design and the modified what-if test bench, thus to generate a what-if result by the simulator;
to extract the sub-design, the computer program product further causes the processor to preserve the design hierarchy of the original design and HDL codes which are out of the what-if design scope are removed from the extracted design;
to extract the sub-design, the computer program product further causes the processor to:
determine whether a system task/function is in the what-if design scope, and
if a system task/function is in the what-if design scope, un-change the system task/function or replace the system task/function with an empty faked task/function based on a type of the system task/function;
to extract the sub-design, the computer program product further causes the processor to:
determine whether a user PLI function is in the what-if design scope, and if a user PLI function is in the what-if design scope, replace the user PLI function with an empty function, wherein signals directly affected by the user PLI function are treated as primary input signals;
to extract the sub-design, the computer program product further causes the processor to:
  determine whether an initial block is in the what-if design scope, and
  if an initial block is in the what-if design scope, remove codes except signal declarations from the initial block;
to extract the sub-design, the computer program product further causes the processor to:
  determine whether a macro reference or an include reference is in the what-if design scope, and
  if a macro reference or an include reference is in the what-if design scope, expand the macro reference or the include reference in the extracted design;
to extract the sub-design, the computer program product further causes the processor to:
  determine whether a module, which is outside of the what-if design scope, contains signals which are hierarchically referenced in the what-if design scope, and
  if the module contains signals which are hierarchically referenced in the what-if design scope, add the module to the design scope and remove codes except declarations of the hierarchically referenced signals from the module, and treating those signals as primary input signals.
to extract the sub-design, the computer program product further causes the processor to:
  analyze design behaviors of the extracted design to obtain restore signals,
  determine a restore time window prior to the what-if time window according to the extracted design and the cycle time of a clock signal,
  extract the what-if simulation data from the simulation result for the restore signals in the restore time window, and
  extracting the what-if simulation data from the simulation result for the primary input signals in the restore time window and the what-if time window;
the computer program product further causes the processor to write out a file for the what-if simulation data;
to generate what-if test bench, the computer program product further causes the processor to generate the what-if test bench to use assignment commands to assign signal values to the primary input signals which are not in-out ports of the extracted design in the what-if time window;
to generate what-if test bench, the computer program product further causes the processor to generate the what-if test bench to use weak assignment commands to assign signal values to primary input signals which are in-out ports of the extracted design in the what-if time window;
to generate what-if test bench, the computer program product further causes the processor to generate the what-if test bench to use at least one delay command in between the setting of signal values to primary input signals based on the event sequence order for the changed time of the respective signal value, such that the event sequence order in the what-if test bench is kept the same with that in the what-if simulation data; or
to generate what-if test bench, the computer program product further causes the processor to generate the what-if test bench to employ a PLI task to read signal values from the what-if simulation data and feed the signal values to the simulator.

* * * * *